United States Patent
von Kluge et al.

(10) Patent No.: US 7,763,514 B2
(45) Date of Patent: Jul. 27, 2010

(54) METHOD OF MANUFACTURING A TRANSISTOR AND MEMORY CELL ARRAY

(75) Inventors: Johannes von Kluge, Dresden (DE); Stefan Tegen, Dresden (DE)

(73) Assignee: Qimonda AG, Munich (DE)

( * ) Notice: Subject to any disclaimer, the term of this patent is extended or adjusted under 35 U.S.C. 154(b) by 266 days.

(21) Appl. No.: 11/851,510

(22) Filed: Sep. 7, 2007

(65) Prior Publication Data
US 2008/0061320 A1 Mar. 13, 2008

Related U.S. Application Data

(63) Continuation-in-part of application No. 11/517,557, filed on Sep. 8, 2006, now Pat. No. 7,612,406.

(51) Int. Cl.
*H01L 21/336* (2006.01)
(52) U.S. Cl. ............... 438/259; 438/156; 257/E21.624; 257/E27.019
(58) Field of Classification Search ......... 438/156, 438/259; 257/E21.624, E21.629, E27.019
See application file for complete search history.

(56) References Cited

U.S. PATENT DOCUMENTS

| | | | |
|---|---|---|---|
| 5,398,205 A | 3/1995 | Yamaguchi | |
| 5,502,320 A | 3/1996 | Yamada | |
| 6,063,669 A | 5/2000 | Takaishi | |
| 6,673,681 B2 * | 1/2004 | Kocon et al. | ............... 438/270 |
| 6,770,535 B2 | 8/2004 | Yamada et al. | |
| 7,034,408 B1 | 4/2006 | Schloesser | |
| 7,129,130 B2 | 10/2006 | Adkisson et al. | |
| 7,393,749 B2 | 7/2008 | Yilmaz et al. | |
| 7,439,135 B2 * | 10/2008 | Cheng et al. | ................ 438/268 |
| 2001/0028084 A1 | 10/2001 | Mo | |
| 2005/0272231 A1 | 12/2005 | Yun et al. | |
| 2006/0043474 A1 * | 3/2006 | Kinzer et al. | ............... 257/330 |
| 2006/0113588 A1 | 6/2006 | Wu | |
| 2006/0120129 A1 | 6/2006 | Schloesser | |
| 2006/0244024 A1 | 11/2006 | Manger | |
| 2006/0267085 A1 * | 11/2006 | Matsuura | ................... 257/330 |

FOREIGN PATENT DOCUMENTS

| | | |
|---|---|---|
| DE | 3801525 A1 | 9/1988 |
| DE | 19928781 C1 | 7/2000 |
| EP | 1003219 A2 | 5/2000 |
| JP | 07193233 A2 | 7/1995 |

\* cited by examiner

*Primary Examiner*—Jerome Jackson, Jr.
*Assistant Examiner*—Paul A Budd
(74) *Attorney, Agent, or Firm*—Edell, Shapiro & Finnan, LLC

(57) ABSTRACT

A transistor of an integrated circuit includes a first and second source/drain regions, a channel region connecting the first and second source/drain regions, and a gate electrode configured to control an electrical current flowing in the channel. The gate electrode is disposed in a gate groove, that is defined in a top surface of a semiconductor substrate. The first and second source/drain regions extend at least to a depth $d_1$, wherein the depth $d_1$ is measured from the top surface of the substrate. A top surface of the gate electrode is disposed beneath the top surface of the semiconductor substrate in a distance to the top surface that is less than the depth $d_1$.

9 Claims, 17 Drawing Sheets

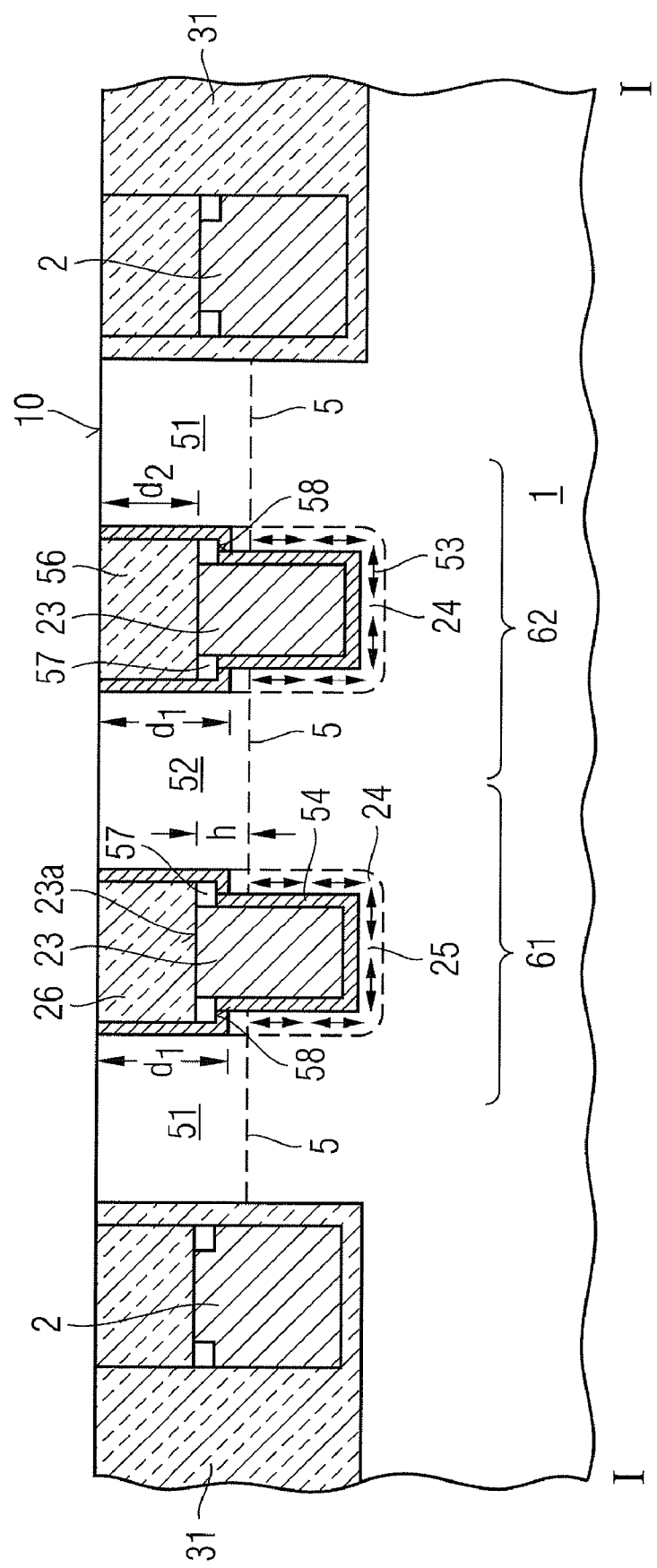

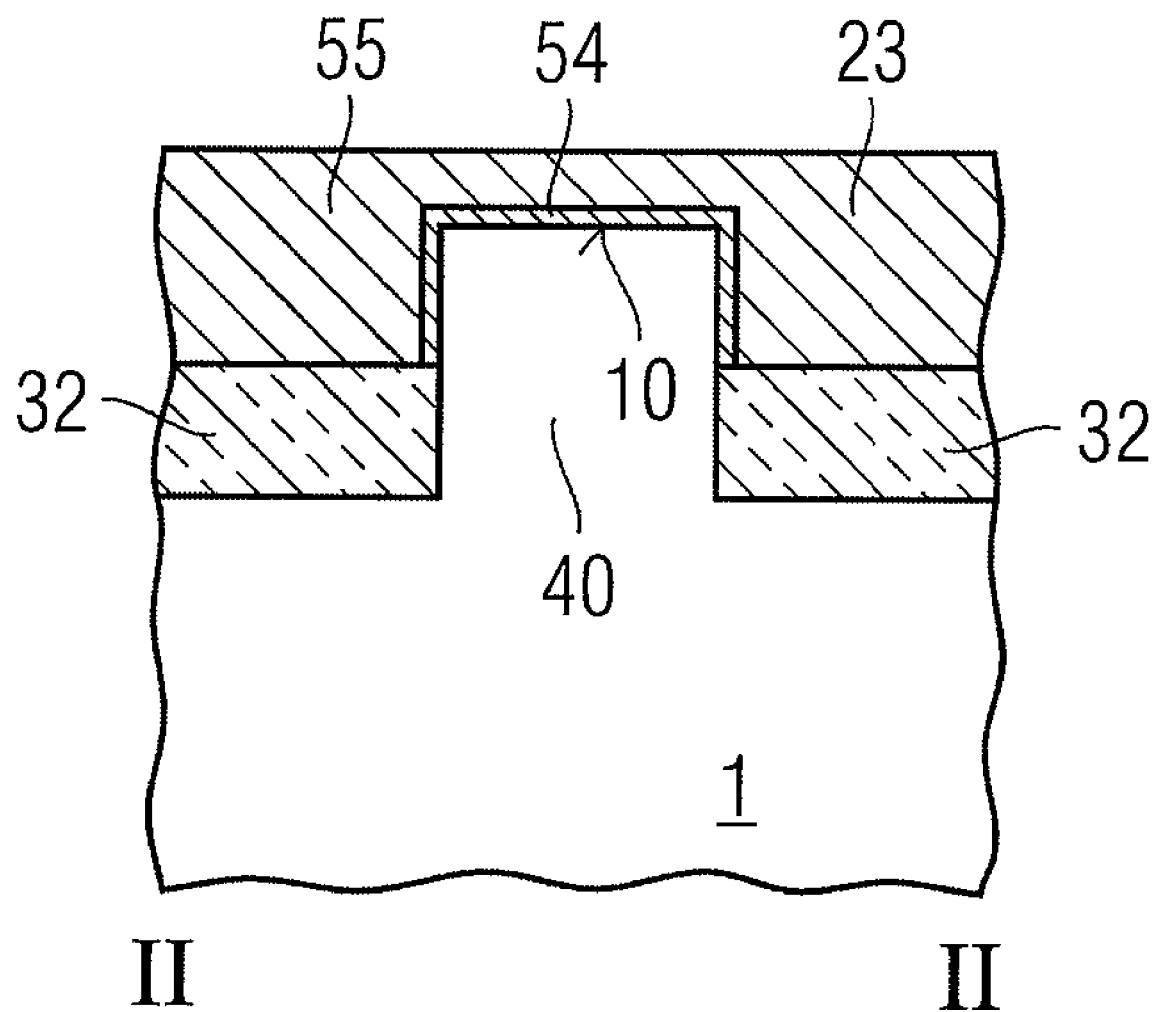

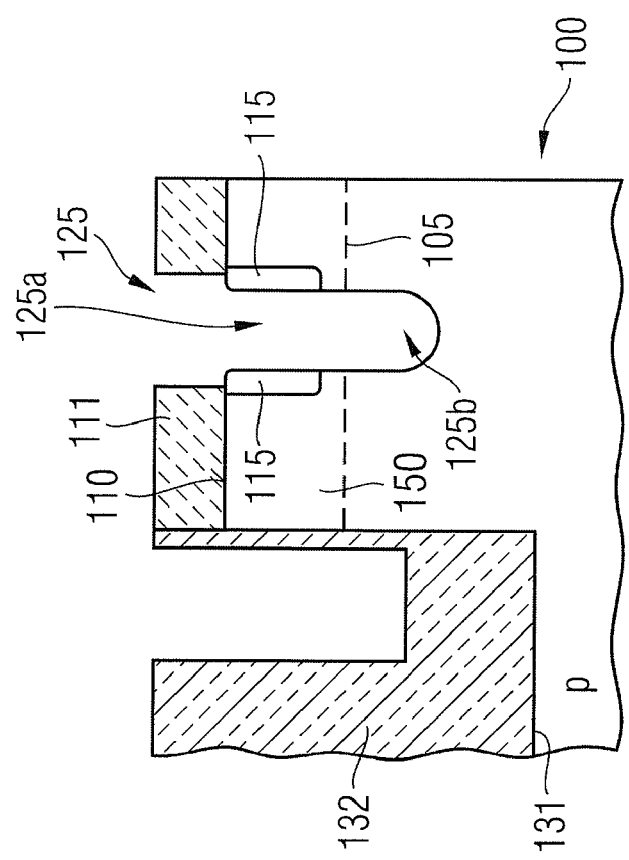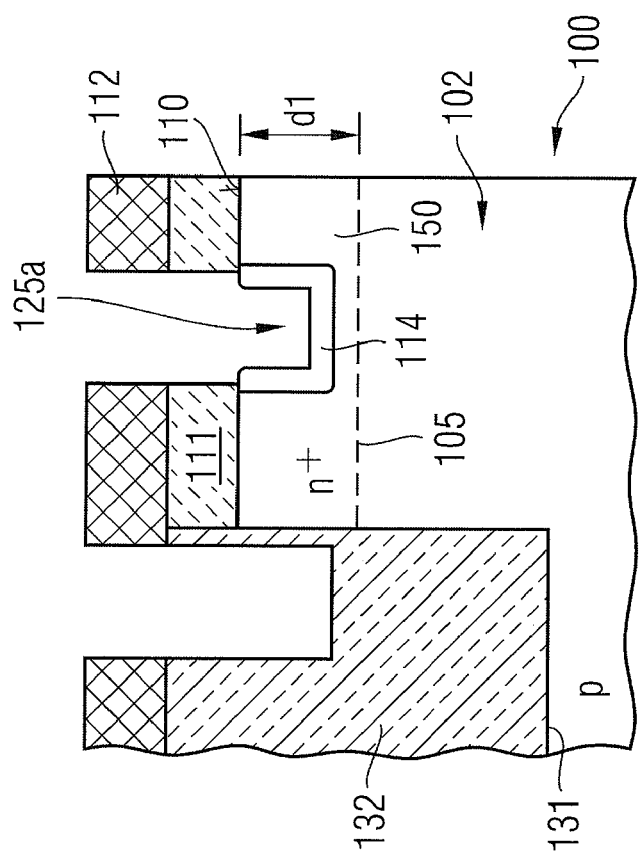

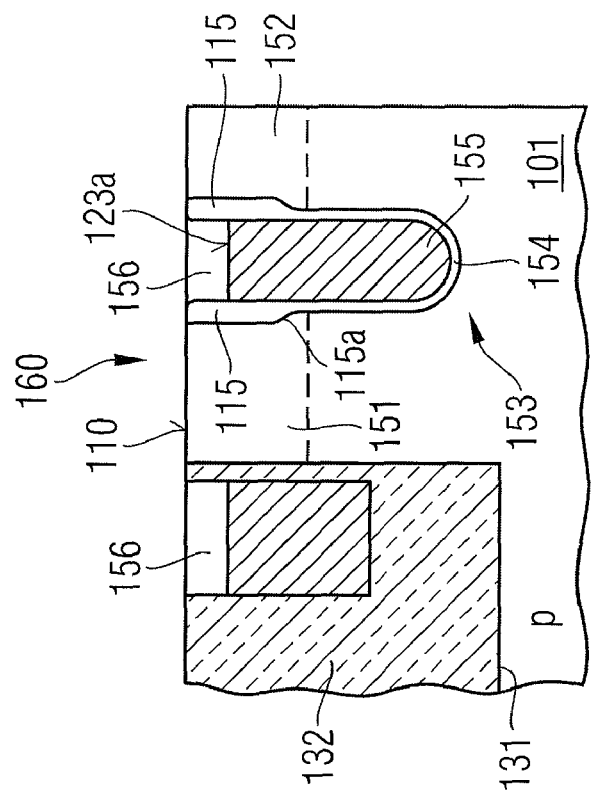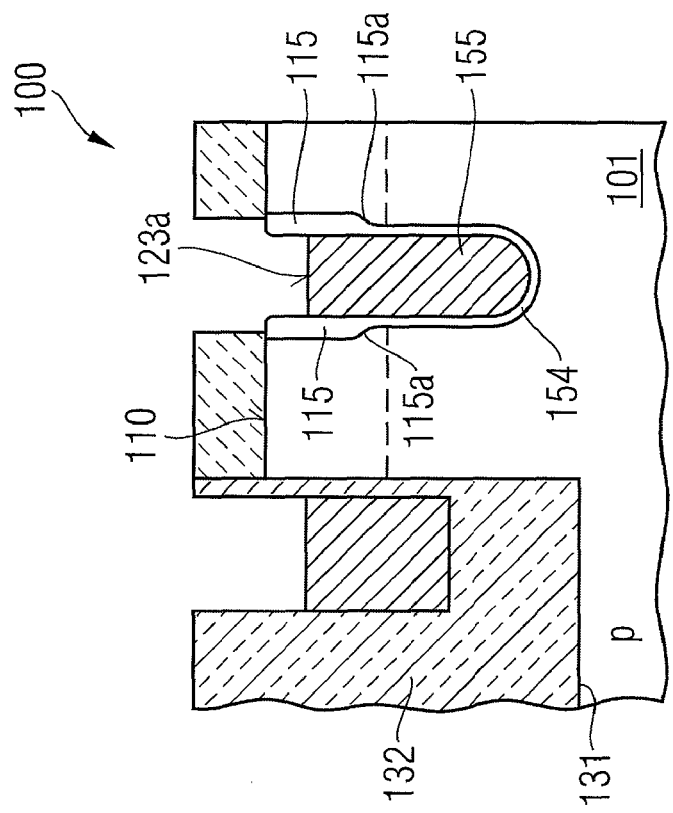

METHOD OF MANUFACTURING A TRANSISTOR AND MEMORY CELL ARRAY

CROSS REFERENCE TO RELATED APPLICATION

This application is a continuation-in-part of U.S. patent application Ser. No. 11/517,557 filed Sep. 8, 2006, entitled "Transistor, Memory Cell Array and Method of Manufacturing a Transistor," the entire contents of which is hereby incorporated by reference.

BACKGROUND

Memory cells of a dynamic random access memory (DRAM) generally include a storage capacitor for storing an electrical charge which represents an information to be stored, and an access transistor which is connected with the storage capacitor. The access transistor includes a first and a second source/drain region, a channel connecting the first and the second source/drain region as well as a gate electrode controlling an electrical current flow between the first and second source/drain region. The transistor usually is at least partially formed in the semiconductor substrate. The gate electrode forms part of a word line and is electrically insulated from the channel by a gate insulating layer. By addressing the access transistor via a corresponding wordline, the information stored in the storage capacitor is read out. In particular, the information is read out to a corresponding bitline via a bitline contact.

In conventional DRAM memory cells, the storage capacitor can be implemented as a trench capacitor in which the two capacitor electrodes are disposed in a trench which extends in the substrate in a direction perpendicular to the substrate surface.

According to another implementation of the DRAM memory cell, the electrical charge is stored in a stacked capacitor, which is formed above the surface of the substrate. Generally, attempts have been made at further shrinking the area needed for a DRAM memory cell. At the same time, it is desirable to obtain optimum characteristics of the access transistor.

Accordingly, an improved transistor as well as an improved method of manufacturing such a transistor is needed. In addition, an improved memory cell array as well as an improved method of forming such a memory cell array is needed.

SUMMARY

The invention relates to a transistor, a method of manufacturing a transistor, and to a memory cell array. A transistor of an integrated circuit includes first and second source/drain regions, a channel region connecting the first and second source/drain regions, and a gate electrode configured to control an electrical current flowing in the channel. The gate electrode is disposed in a gate groove that is defined in a top surface of a semiconductor substrate. The first and second source/drain regions extend at least to a depth d1, wherein the depth d1 is measured from the top surface of the substrate. A top surface of the gate electrode is disposed beneath the top surface of the semiconductor substrate in a distance to the top surface that is less than the depth d1.

The above and still further features and advantages of the present invention will become apparent upon consideration of the following detailed description of specific embodiments thereof, particularly when taken in conjunction with the accompanying drawings wherein like reference numerals in the various figures are utilized to designate like components.

It is noted that the accompanying drawings are included to provide a further understanding of the present invention and are incorporated in and constitute a part of this specification. The drawings illustrate the embodiments of the present invention and together with the description serve to explain the principles of the invention. Other embodiments of the present invention and many of the intended advantages of the present invention will be readily appreciated as they become better understood by reference to the following detailed description. The elements of the drawings are not necessarily to scale relative to each other.

BRIEF DESCRIPTION OF THE DRAWINGS

FIG. 1 shows a schematic cross-sectional view of the completed transistor in accordance with an exemplary embodiment.

FIGS. 5A to 5C show different views of the substrate after depositing a conductive material in accordance with the exemplary embodiment.

FIGS. 10A to 10D are cross-sectional views of a substrate for illustrating a method of fabricating an integrated circuit comprising a MOSFET with vertical and horizontal channel sections according to a further exemplary embodiment.

DETAILED DESCRIPTION

Figure 2A:
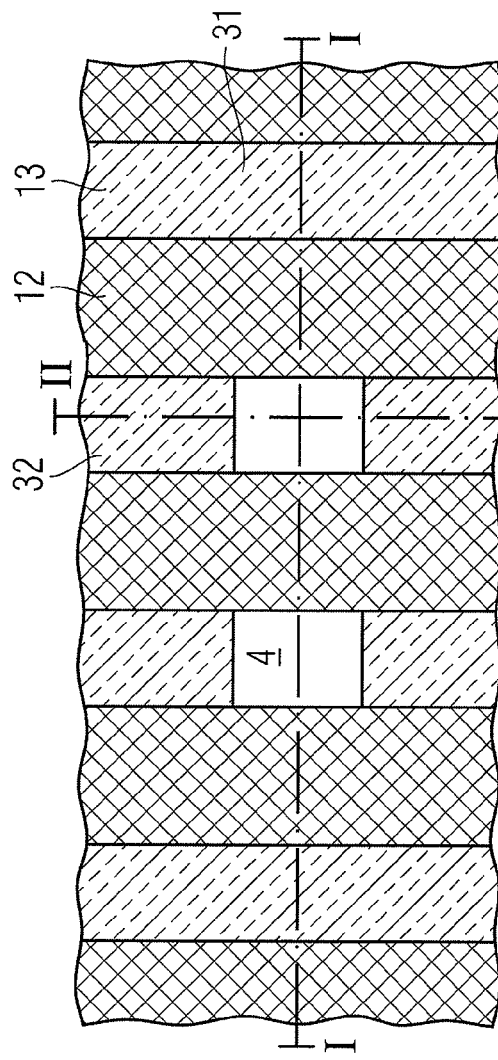
FIGS. 2A to 2C show different views of a substrate after performing first processing steps in accordance with an exemplary embodiment.

In accordance with the present invention, a transistor is formed in a semiconductor substrate, the substrate including a top surface. The transistor comprises a first source/drain region and a second source/drain region, a channel connecting the first and second source/drain regions, and a gate electrode to control an electrical current flowing in the channel, where the gate electrode is disposed in a gate groove. The gate groove is defined in the top surface of the semiconductor substrate, where the first and second source/drain regions extend at least to a depth d1, the depth d1 being measured from the top surface of the substrate. A top surface of the gate electrode is disposed beneath the top surface of the semiconductor substrate, and the top surface of the gate electrode is disposed at a depth d2 which is smaller or less than the depth d1, the depth d2 being measured from the top surface of the substrate.

A memory cell array is also provided in accordance with the invention. The memory cell array comprises memory cells, each of the memory cells comprising a storage element and an access transistor, bit lines running along a first direction, word lines running along a second direction, the second direction intersecting the first direction, a semiconductor substrate, the access transistors being formed in the semiconductor substrate, the access transistors electrically coupling corresponding storage elements to corresponding bit lines, the access transistors being addressed by the word lines, the access transistors comprising doped portions being arranged adjacent to the substrate surface, the doped portions extending to a depth d1, where a top surface of each of the word lines is disposed beneath the top surface of the semiconductor substrate and the top surface of each of the word lines is disposed at a depth d2 which is smaller or less than the depth d1, the depth d2 being measured from the substrate surface.

A transistor is also formed in accordance with the invention, where the transistor is formed in a semiconductor substrate including a top surface. The transistor comprises a first and a second source/drain region, a first direction being defined by a line connecting or extending between the first and second source/drain region, a channel connecting the first and second source/drain region, and a gate electrode to control an electrical current flowing in the channel, where the gate electrode is disposed in a gate groove, the gate groove being defined in the top surface of the semiconductor substrate. A top surface of the gate electrode is disposed beneath the top surface of the semiconductor substrate, an upper groove portion being disposed above the top surface of the gate electrode and beneath the top surface of the semiconductor substrate and the width of the upper groove portion is larger than the width of the gate electrode, the width being measured along the first direction.

A method of forming a transistor in accordance with the invention comprises providing a semiconductor substrate including a surface, providing a gate groove extending in the substrate surface, providing a first and a second source/drain region, the first and the second source/drain region being adjacent to the substrate surface, the first and second source/drain region extending to a depth d1 measured from the substrate surface, providing a spacer on a sidewall of the gate groove, the sacrificial spacer extending from the substrate surface to a depth which is smaller or less than d1, providing a gate conductive material so that a top surface of the gate conductive material is disposed beneath the top surface of the semiconductor substrate so that the top surface of the gate electrode is disposed at a depth d2 which is smaller or less than the depth d1, the depth d2 being measured from the substrate surface above the depth d1, an upper groove portion being disposed above the gate conductive material, and filling the upper groove portion with an insulating material.

Further, a transistor is formed in accordance with the invention, where the transistor is in a semiconductor substrate including a top surface. The transistor comprises a first and a second doped region, a channel connecting the first and second doped region, means for controlling an electrical current flowing in the channel, where the means for controlling the electrical current is disposed in a groove, the groove being defined in the top surface of the semiconductor substrate, where the first and second doped region extend at least to a depth d1, the depth d1 being measured from the top surface of the substrate, where a top surface of the means for controlling the electrical current is disposed beneath the top surface of the semiconductor substrate and the top surface of the means for controlling an electrical current is disposed at a depth d2 which is smaller or less than the depth d1, the depth d2 being measured from the substrate surface.

In the followed detailed description reference is made to the accompanying drawings, which form a part hereof and in which is illustrated by way of illustration specific embodiments in which the invention may be practiced. In this regard, directional terminology such as "top", "bottom", "front", "back", "leading", "trailing", etc., is used with reference to the orientation of the figures being described. Since components of embodiments of the present invention can be positioned in a number of different orientations, the directional terminology is used for purposes of illustration and in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims.

FIG. 1 shows a cross-sectional view of a semiconductor substrate incorporating a first and a second transistor 61, 62 according to an exemplary embodiment. In particular, each of the access transistors 61, 62 comprises a first and a second source/drain region 51, 52 which may, for example, be implemented as n-doped portions, respectively. In the shown layout, the two adjacent access transistors 61, 62 share one common second source/drain region 52. Between the first and second source/drain region 51, 52, a gate electrode 23 is provided. The gate electrode 23 extends in the substrate surface. Accordingly, a channel which is formed between the first and second source/drain region 51, 52 has a curved shape which is delimited at one side thereof by the gate electrode 23. The gate electrode 23 is insulated from the channel 53 by the gate insulating layer 54. Moreover, as can be seen from FIG. 1, optionally the gate electrode 23 further comprises plate-like portions 24 which extend in the plane before and behind the illustrated plane of the drawing. Accordingly, in this exemplary embodiment, the channel comprises a fin-like portion in which the channel has the shape of a ridge, in a cross-section which is perpendicular to the cross-sectional view shown in FIG. 1. The ridge comprises a top side and two lateral sides. Accordingly, the plate-like portions 24 of the gate-electrode delimit the channel 53 at the two lateral sides thereof. Hence, due to the presence of the plate-like portions, the channel 53 may become fully depleted.

The surface 23a of each of the gate electrodes 23 is disposed beneath the substrate surface 10. In particular, a distance between a top surface 23a of the gate electrode and the substrate surface 10 is denoted as d2. An insulating layer 56 is disposed above each of the gate electrodes 23, so as to fill the groove, in which the gate electrode is formed. Hence, the gate electrodes 23 are fully buried. Furthermore, a vacuum spacer 57 is disposed at each of the lateral sides of the gate electrode 23. The vacuum spacer 57 effectively shields the gate electrode 23 from the adjacent source/drain regions 51, 52. A bottom side 58 of the vacuum spacer is disposed above the bottom side 5 of each of the first and second source/drain regions 51, 52. Moreover, the bottom side 58 of the vacuum spacer is disposed beneath the top surface 23a of each of the gate electrodes 23. Accordingly, d2 is smaller or less than d1. In particular, as can be seen from FIG. 1, the top surface 23a of each of the gate electrodes 23 is disposed above the bottom side 5 of each of the first and second source/drain regions 51, 52. Accordingly, the conductivity of the channel 53 is controlled by the gate-electrode at the whole length of the channel. As a result, the resistance of the transistor 61, 62 is reduced. As can be taken from FIG. 1, the difference between the top side of the gate electrode 23 and the bottom side of the doped regions 51, 52 is denoted as "h". For example, h may be more than 10 or 20 nm. In addition, the bottom side of the doped regions 51, 52 is disposed at the depth d1, this depth being measured from the substrate surface 10.

In the isolation trenches 31 which are adjacent to the access transistors 61, 62, the buried wordlines 2 may be disposed, thus forming passing wordlines. Likewise, the isolation trenches 31 may be omitted, a so-called isolation device being formed at the position of these isolation trenches 31. To be more specific, in this case, the wordlines 2 are set at an appropriate voltage so as to electrically isolate the transistor 61 from the portion on the left hand side thereof, whereas the transistor 62 is electrically isolated from the right-hand side thereof. According to another embodiment trench capacitors (not shown in this drawing) may be disposed at the position of the isolation trenches 31, thus laterally insulating adjacent memory cells from each other.

As can further be seen from FIG. 1, an upper groove portion 26 is disposed above the gate electrode 23 in the gate groove 25. The upper groove portion is filled with an insulating material. As can be seen, the width of the upper groove portion 26 is larger than the width of the gate electrode, the width being measured along a first direction which is defined by a line connecting the first and second source/drain region 51, 52. For example, the width of the gate electrode 23 may include the width of the gate insulating layer 54.

A method of manufacturing the transistor shown in FIG. 1 is now explained below.

In a first step, a semiconductor substrate is provided. For example, the semiconductor substrate may be a silicon substrate, which is, for example, p-doped. After performing the usual implantations steps for providing the required well dopings, a doped portion 50 which is adjacent to the substrate surface 10 is provided by an ion implantation step. For example, this doping step is performed using an n dopant. For example, the doped portion 50 may extend to a depth d1 of approximately 50 to 100 nm. Accordingly, the bottom side 5 of the doped portion 50 is located approximately 50 to 100 nm beneath the substrate surface 10.

Thereafter, a silicon nitride layer 11 acting as a pad nitride layer is deposited by usual methods. For example, the silicon nitride layer 11 may have a thickness of approximately 100 nm. Thereafter, isolation trenches 31, 32 are defined and filled with an insulating material. By defining the isolation trenches 31, 32, also the active areas 4 are defined. For example, the active areas may be formed, having a shape of segments of lines. Alternatively, the active areas 4 may as well be formed as a continuous active area lines as will be explained later. For example the width of each of the active areas 4 corresponds to F where F is the minimal structural feature size which may be obtained by the technology employed. For example, F may be 105, 95, 85, 75, 65, 55, 40 nm or even less. After filling the isolation trenches 31, 32 with an insulating material, a hardmask layer 12 is deposited. For example, carbon may be taken as the hardmask material. In particular, such a carbon hardmask layer is made of elemental carbon, i.e., carbon which is not contained in a chemical compound, optionally including additives such as hydrogen. The carbon layer may be deposited using generally known methods like a CVD method. For example, the carbon hardmask layer 12 may have a thickness of approximately 300 nm.

After depositing the carbon hardmask layer, the carbon hardmask layer 12 is patterned, for example, using a photolithographic method as is common or conventional in the art. In particular, a photoresist material may be applied on top of the carbon hardmask layer followed by an exposure step. For example, for performing this exposure step, a mask having a lines/spaces pattern may be used. After correspondingly patterning the photoresist material, the pattern is transferred into the carbon hardmask layer 12 and the silicon nitride layer 11. For example, a selective etching step for etching silicon nitride and silicon dioxide may be performed. During this etching step, the silicon nitride layer 11 and the insulating material of the isolation trenches 31 are etched whereas silicon substrate material is not etched.

Figure 2B:
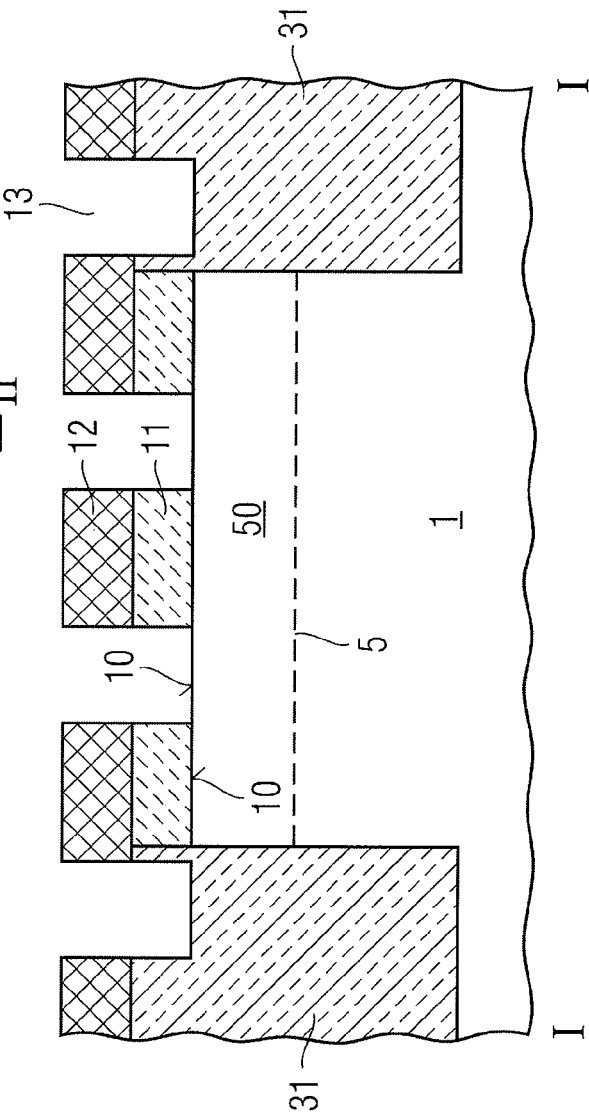

The resulting structure is shown in FIG. 2. In particular, FIG. 2A shows a plan view on the resulting structure. As can be seen, segments of active area lines 4 are formed. The active areas 4 are completely surrounded by the isolation trenches 31, 32. On top of the isolation trenches 31, 32 lines 12 of the carbon hardmask material are disposed. In the shown embodiment, the active area lines 4 perpendicularly intersect the carbon hardmask lines 12. Alternatively, the carbon hardmask lines 12 may intersect the active areas 4 at a different angle. This may, for example, be useful in a case in which the active areas 4 are implemented as continuous lines. FIG. 2B shows a cross-sectional view of the resulting structure between I and I. As is shown, the active area is delimited on each side thereof by the isolation trenches 31. The doped portion 50 is adjacent to the substrate surface 10. Hardmask openings 13 are formed. Thus, lines of the carbon hardmask 12 and the silicon nitride layer 11 are arranged on the surface 10 of the semiconductor substrate.

Figure 2C:
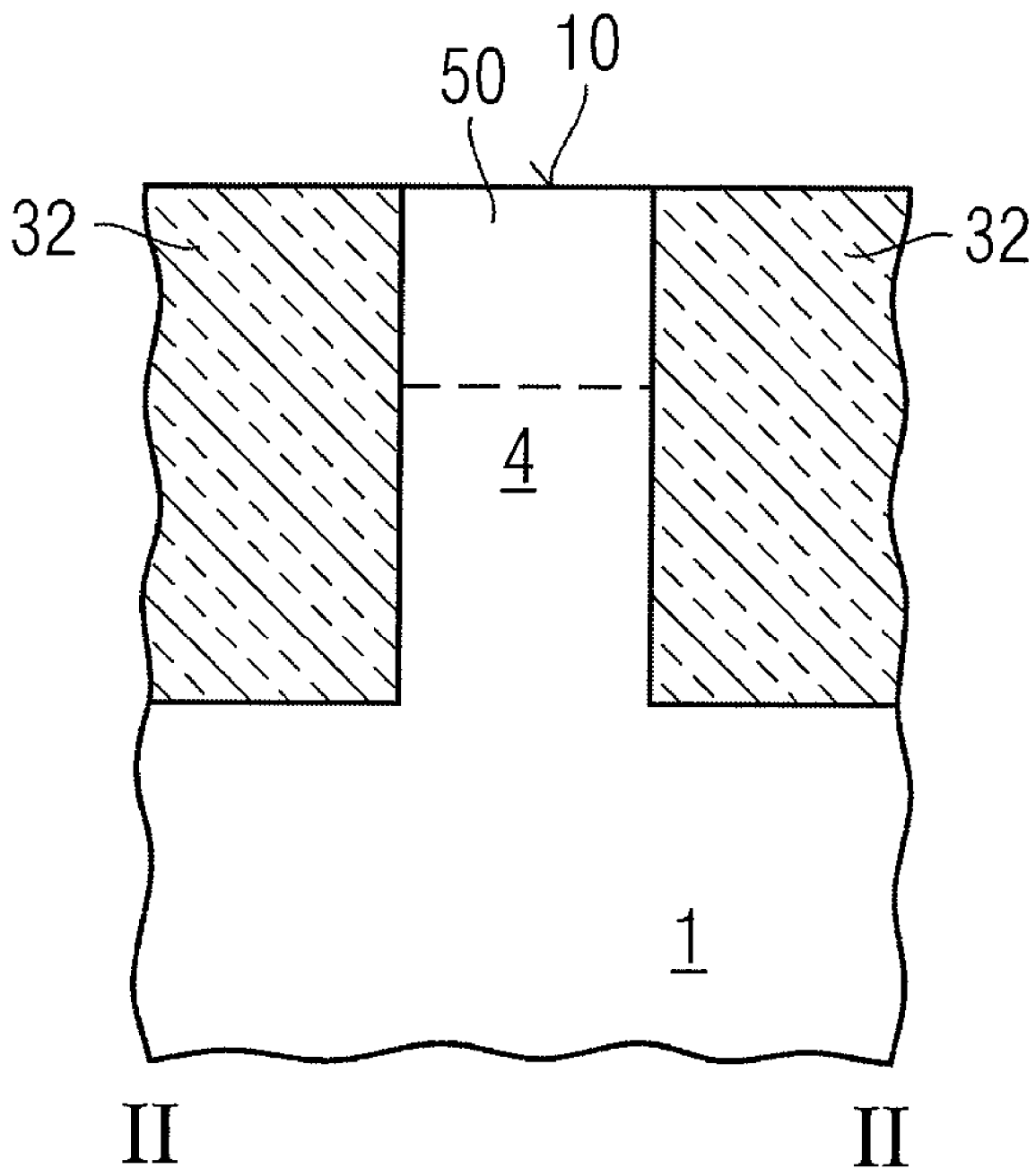

FIG. 2C shows a cross-sectional view of the resulting structure, this cross-sectional view being taken between II and II. As can be seen, an active area 4 is formed between two adjacent isolation trench portions 32. The surface 10 of the semiconductor substrate 1 is at the same level as the isolation trenches 32. For example, the isolation trenches may extend to a depth of 200 to 300 nm.

In the next step, taking the patterned hardmask material 12 as an etching mask, an unselective etching step is performed. For example, this etching step may etch silicon and silicon dioxide. In particular this etching step is performed so as to obtain an etching depth which corresponds to the height of the top surface of the gate electrode 23 to be formed. For example, this etching step may stop well above the bottom side of the doped portion 50. For example, the depth of the formed groove 25 may be 5 to 20 nm. Thereafter, a sacrificial layer 14 is deposited. For example, the sacrificial layer 14 may be made of silicon nitride, which may be deposited, for example, by a plasma CVD method. As a result, the layer 14 is formed on the whole surface.

Figure 3A:
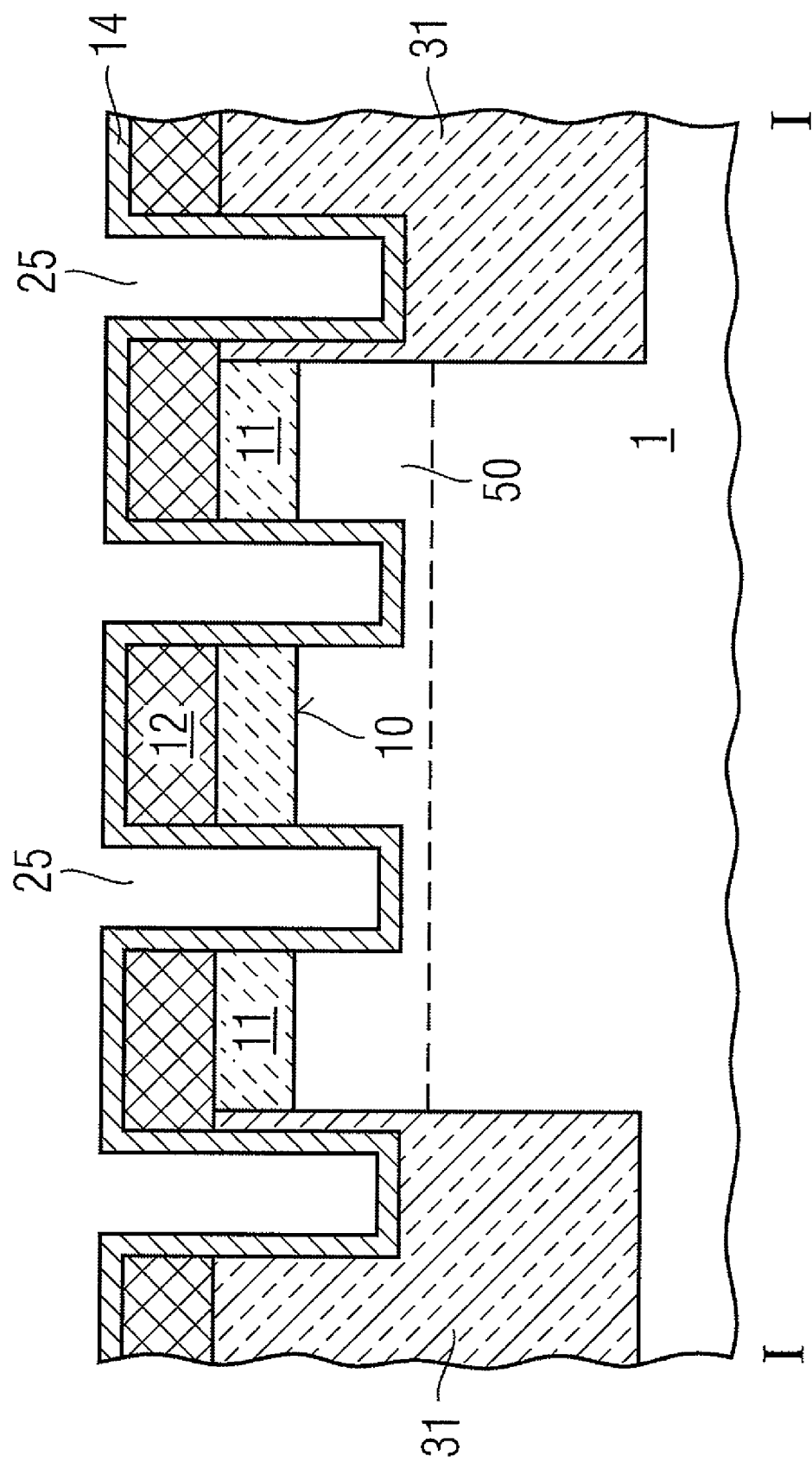
FIGS. 3A and 3B show different views of the substrate after performing an etching step and depositing a silicon nitride liner in accordance with the exemplary embodiment.

FIG. 3A shows a cross-sectional view of the resulting structure. As can be seen, now, gate grooves 25 are formed in the surface 10 of the semiconductor substrate 1. Moreover, the entire surface is covered with the silicon nitride layer 14.

Figure 3B:
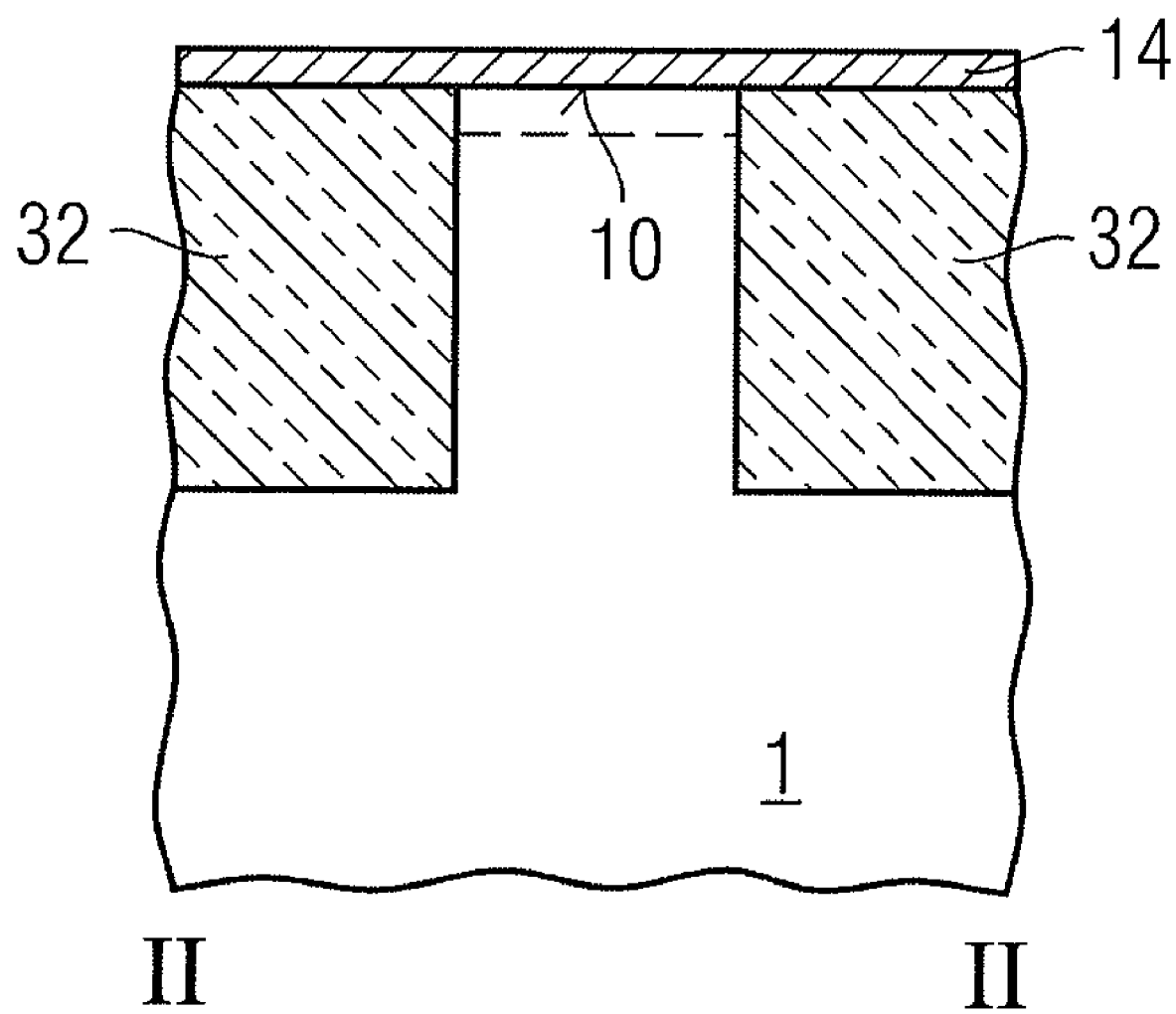

In addition, FIG. 3B shows a cross-sectional view between II and II. As can be seen, the surface of the isolation trenches 32 as well as the surface of the semiconductor substrate 1 are recessed and covered with the silicon nitride layer 14.

Thereafter, an anisotropic etching step is performed so as to remove the horizontal portions of the silicon nitride layer. As a result, a sacrificial spacer 15 is formed on the sidewall portions of each of the gate grooves 25. Thereafter, an etching step is performed which etches silicon and silicon dioxide. As a result, the gate grooves 25 are extended. As can be seen from FIG. 4B for example, the bottom side 25a of each of the gate grooves 25 now is disposed beneath the bottom side 5 of the doped portion 50. For example, the resulting gate grooves may extend to a depth of approximately 100 to 200 nm, for example 130 to 170 nm and, by way of example, 150 nm. Moreover, the width of each of the gate grooves 25 may be approximately F. Thereafter, the carbon hardmask material 12 may be stripped from the surface.

Thereafter, optionally, the plate-like portions of the gate electrode may be defined. To this end, an etching step which etches silicon dioxide selectively with respect to silicon may be performed. For example, the etching depth of the silicon dioxide material may be equal to the thickness of the sacrificial spacer 15. Consequently, the insulating material of the isolation trenches 31, 32 is etched. As a result, the active area 4 has the shape of a ridge, which is exposed at three sides thereof. The resulting structure is shown in FIG. 4.

Figure 4A:
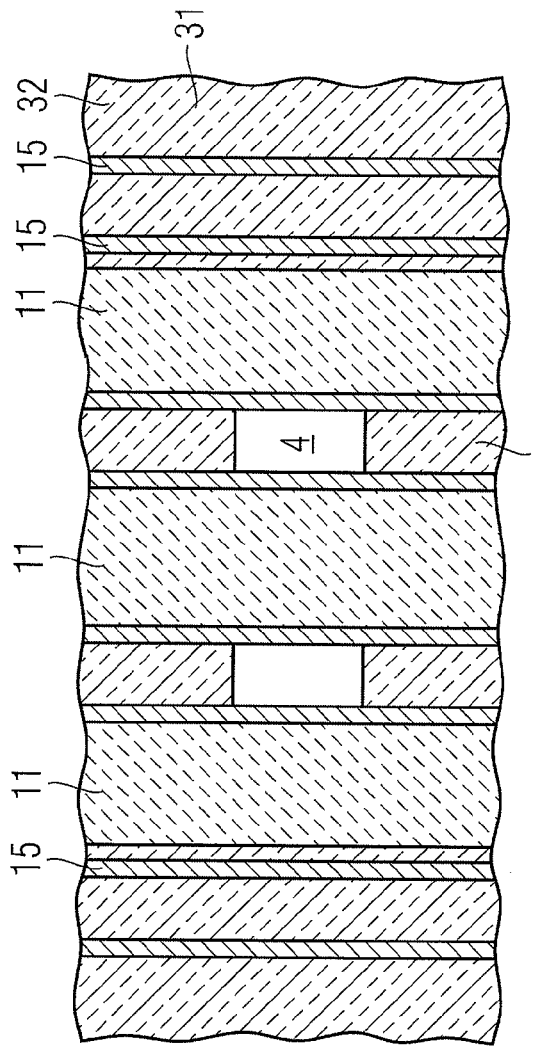
FIGS. 4A to 4C show different views of the substrate after performing a further etching step in accordance with the exemplary embodiment.
Figure 4B:
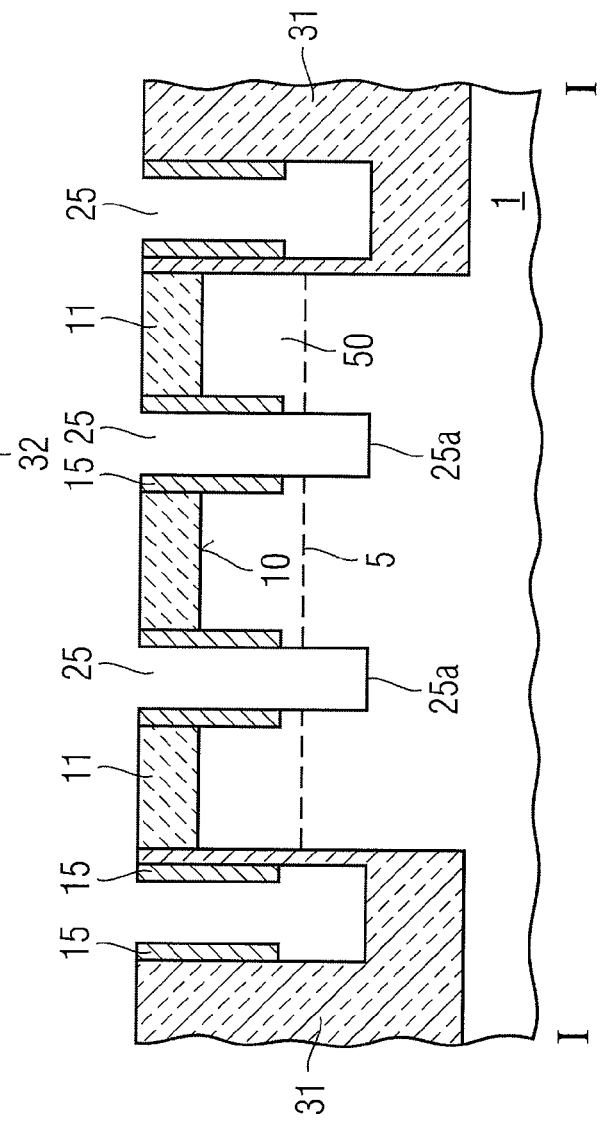
Figure 4C:
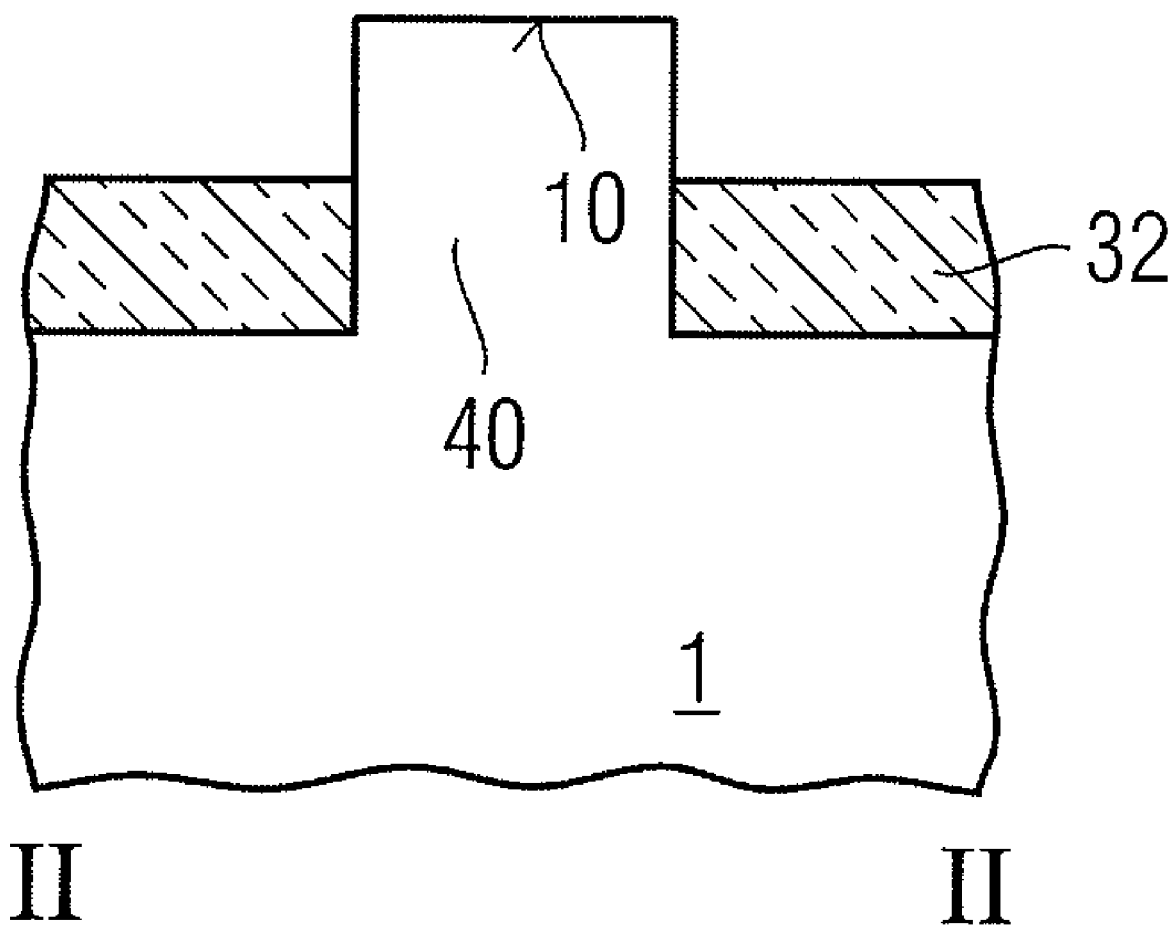

In particular, FIG. 4A shows a plan view of the resulting structure. As can be seen, lines of the silicon nitride layer 11 are disposed on the substrate surface. Moreover, thin lines 15 of the sacrificial spacer are disposed on the substrate surface. Moreover, FIG. 4B shows a cross-sectional view of the structure between I and I. As can be seen, the gate grooves 25 are completed so as to extend below the bottom side 5 of the doped portion 50. Moreover, the gate grooves 25 which are disposed in the first isolation trench portions 31 are widened, due to the silicon dioxide etching step. As can be seen from the cross-sectional view between II and II, which is shown in FIG. 4C, now, the active area 4 has the shape of a ridge 40. Adjacent to the two lateral sides of the ridge 40, the second isolation trench portions 32 are disposed. Moreover, in the upper portion of the ridge, three sides thereof are uncovered.

Thereafter, the gate insulating material 54 is provided. For example, this may be accomplished by performing a thermal oxidation step so as to provide a silicon oxide layer. Thereafter, a conductive filling 55 is provided in each of the gate grooves, followed by a recessing step. For example, the conductive filling may comprise a metal, such as tungsten. For example, the metal filling may be provided by, first, depositing a TiN liner and, thereafter, a tungsten filling. Then, a CMP (chemical mechanical polishing) step is performed, followed by a recessing step. During this recessing step, the conductive material is etched back so that the resulting surface of the metal filling is disposed beneath the substrate surface 10. Accordingly, the top surface 23a of the resulting gate electrode 23 is disposed beneath the surface 10 of the substrate.

Figure 5A:
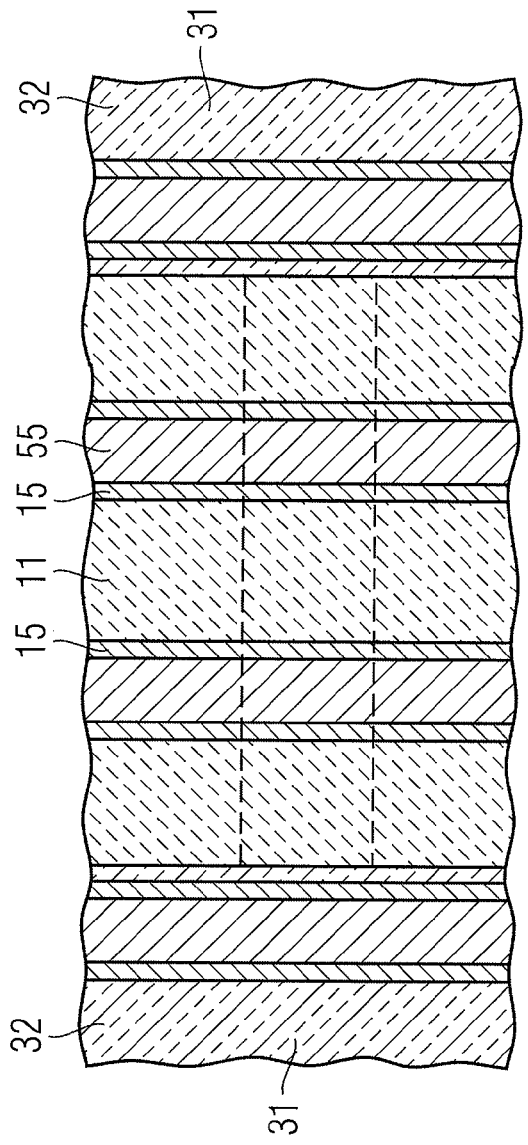
Figure 5B:
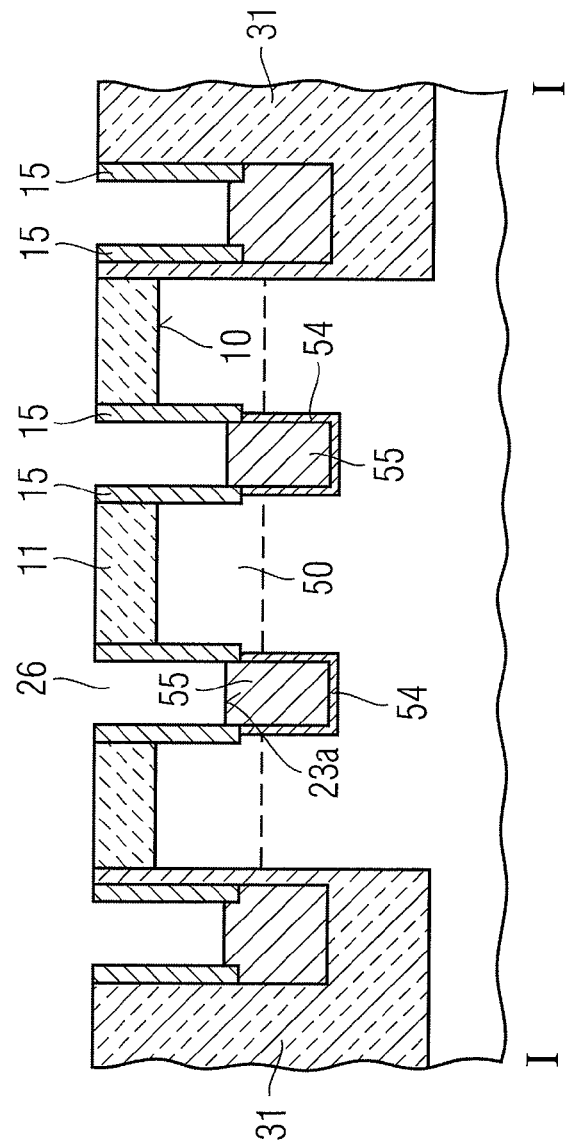

The resulting structure is shown in FIG. 5. As can be seen from FIG. 5A, now, lines of the conductive material 55 are provided, being spaced apart by the silicon nitride lines 11. A cross-sectional view of the resulting structure is shown in FIG. 5B. As can be seen, the top surface 23a of the conductive material 55 is disposed above the bottom side of each of the sacrificial spacers 15. Moreover, the top side 23a of each of the gate electrodes is disposed above the bottom side 5 of the doped portion 50. No filling is disposed in the upper groove portion 26. A further cross-sectional view is shown in FIG. 5C. As can be seen, the gate electrode 23 now is disposed adjacent to three sides of the ridge 40.

Thereafter, the sacrificial spacer is removed. For example a wet etching step using $H_3PO_4$ may be employed so as to remove the silicon nitride spacer 15. By this etching step silicon nitride is etched selectively with respect to tungsten, TiN and silicon oxide. Optionally, thereafter, a re-oxidation step may be performed so as to provide a silicon oxide layer. Thereafter, the silicon oxide filling 56 is provided. For example, this may be accomplished by performing a non-conformal silicon oxide deposition step. For example, this may be accomplished by performing a CVD method for using TEOS (tetraethylorthosilicate) as a starting material. As an alternative, first, a silicon oxide liner may be deposited using a CVD method using TEOS, followed by a HDP (high density plasma) deposition method. During these steps, due to the non-conformal deposition step, a vacuum spacer 57 remains between the upper portion of the conductive material 55 and the sidewalls of the gate groove 25. Accordingly, a vacuum spacer 57 is formed, thus forming a so-called low-k spacer. As an alternative, the space in which the vacuum spacer 57 is formed may as well be filled with an arbitrary low-k dielectric. In this regard, the term "low-k dielectric" refers to a dielectric material having a dielectric constant ∈r<3.9, that is a dielectric constant which is lower than the dielectric constant of silicon dioxide.

Figure 6A:
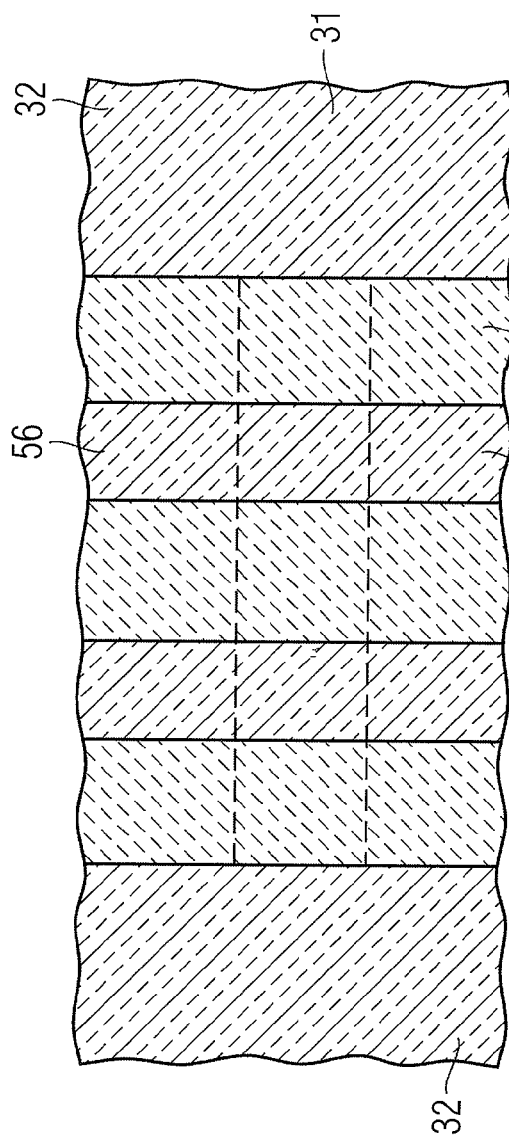
FIGS. 6A to 6C show different views of the substrate after depositing an insulating material.
Figure 6B:
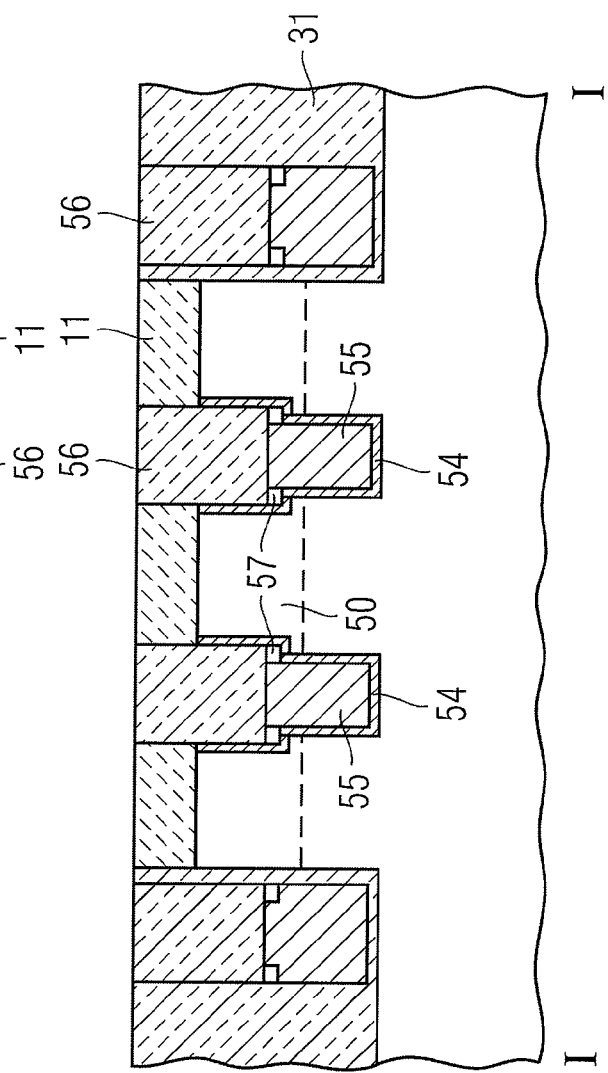
Figure 6C:
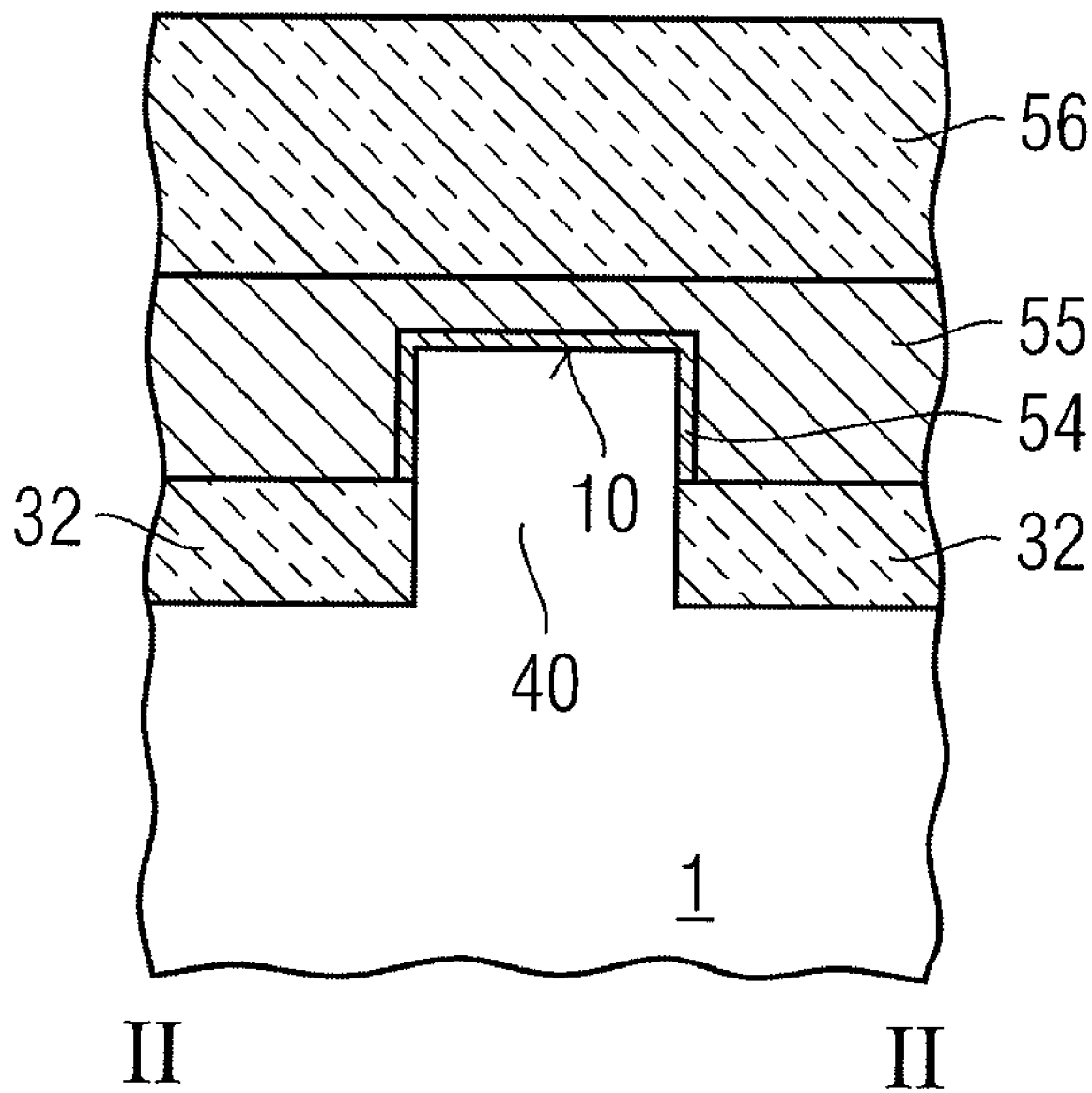

FIG. 6A shows a plan view of the resulting structure. As can be seen, the whole structure now is covered with silicon oxide and silicon nitride lines 11. Moreover, as can be seen from FIG. 6B, the upper portion 26 of the gate groove is filled with silicon oxide material 56. Accordingly, the gate electrode 23 is completely buried, i.e., the upper surface 23a of the gate electrode is disposed beneath the substrate surface 10. FIG. 6C shows a cross-sectional view of the resulting structure between II and II. Thereafter, a deglazing step is performed so as to remove silicon oxide material from the surface. Moreover, the silicon nitride material 11 is stripped from the substrate surface.

Figure 7A:
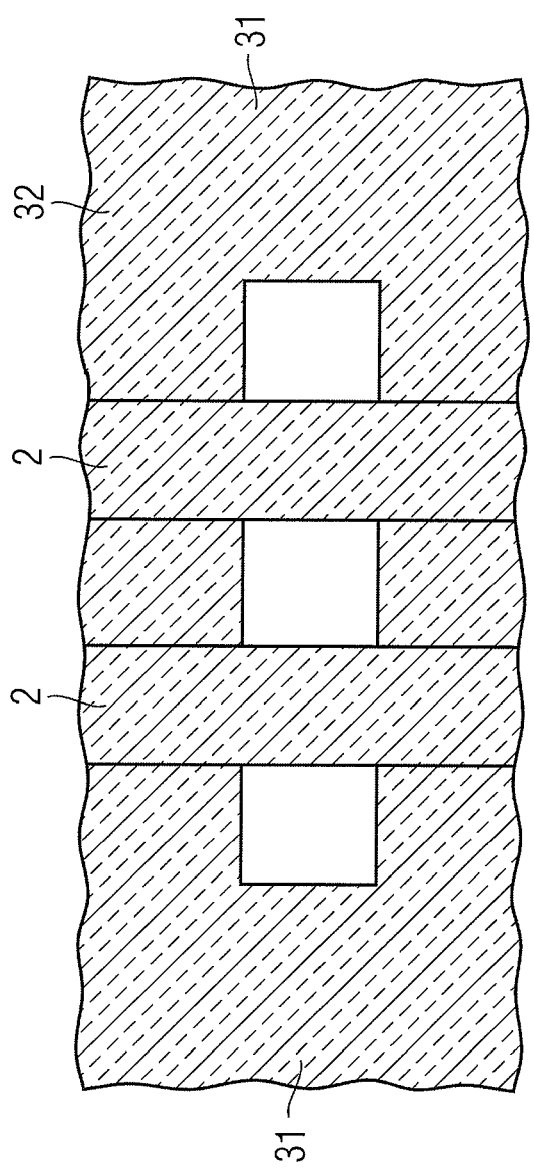
FIGS. 7A and 7B show different views of the substrate after removing the pad nitride layer in accordance with the exemplary embodiment.
Figure 7B:
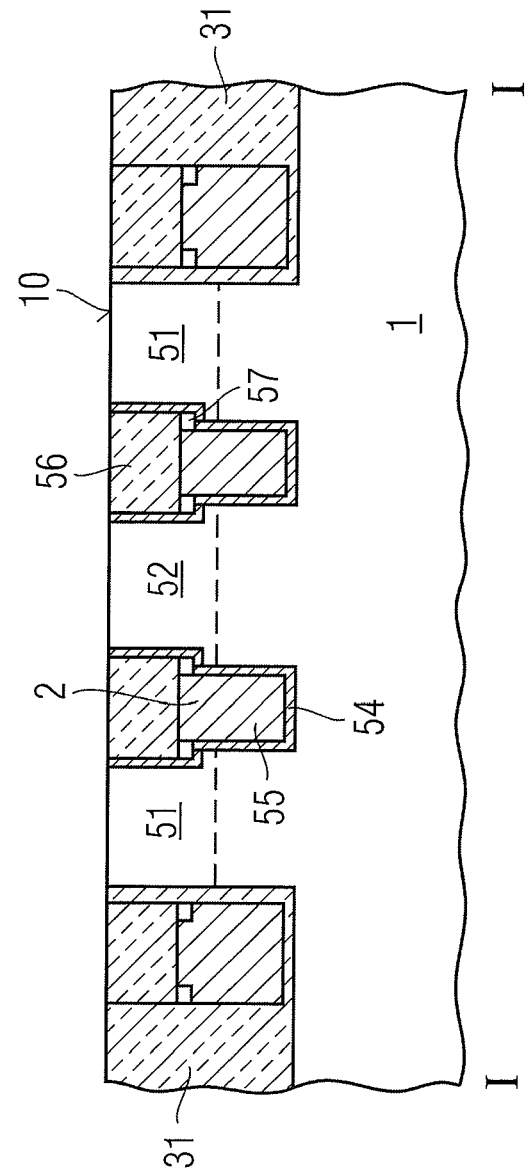

The resulting structure is shown in FIG. 7. In particular, FIG. 7A shows a plan view on the resulting structure. As can be seen, wordlines 2 are formed so as to extend in a first direction. The wordlines 2 are covered with a silicon oxide material. Moreover, FIG. 7B shows a cross-sectional view between I and I. As can be seen, the wordlines 2 are completely buried. The surface of the silicon oxide material 56 is disposed at the same height as the substrate surface 10.

Thereafter, the memory cell array is completed by performing the usual processing steps. In particular, bitlines 8 are provided, which are connected with the corresponding second source/drain regions 52. The bitlines 8 are connected with the corresponding second source/drain regions via a bitline contact 41. Moreover, storage capacitors are provided. By way of example, the storage capacitors may have been provided before performing the process steps which have been described hereinabove with reference to FIGS. 2 to 7. In this case, for example, the trench capacitors may be formed at the position of each of the first isolation trench portions 31. As an alternative, the storage capacitors may as well be implemented as stacked capacitors which are disposed above the substrate surface. In this case, after defining the bitlines 8, node contacts 42 are provided, followed by the steps of patterning the components of the storage capacitor.

Figure 8A:
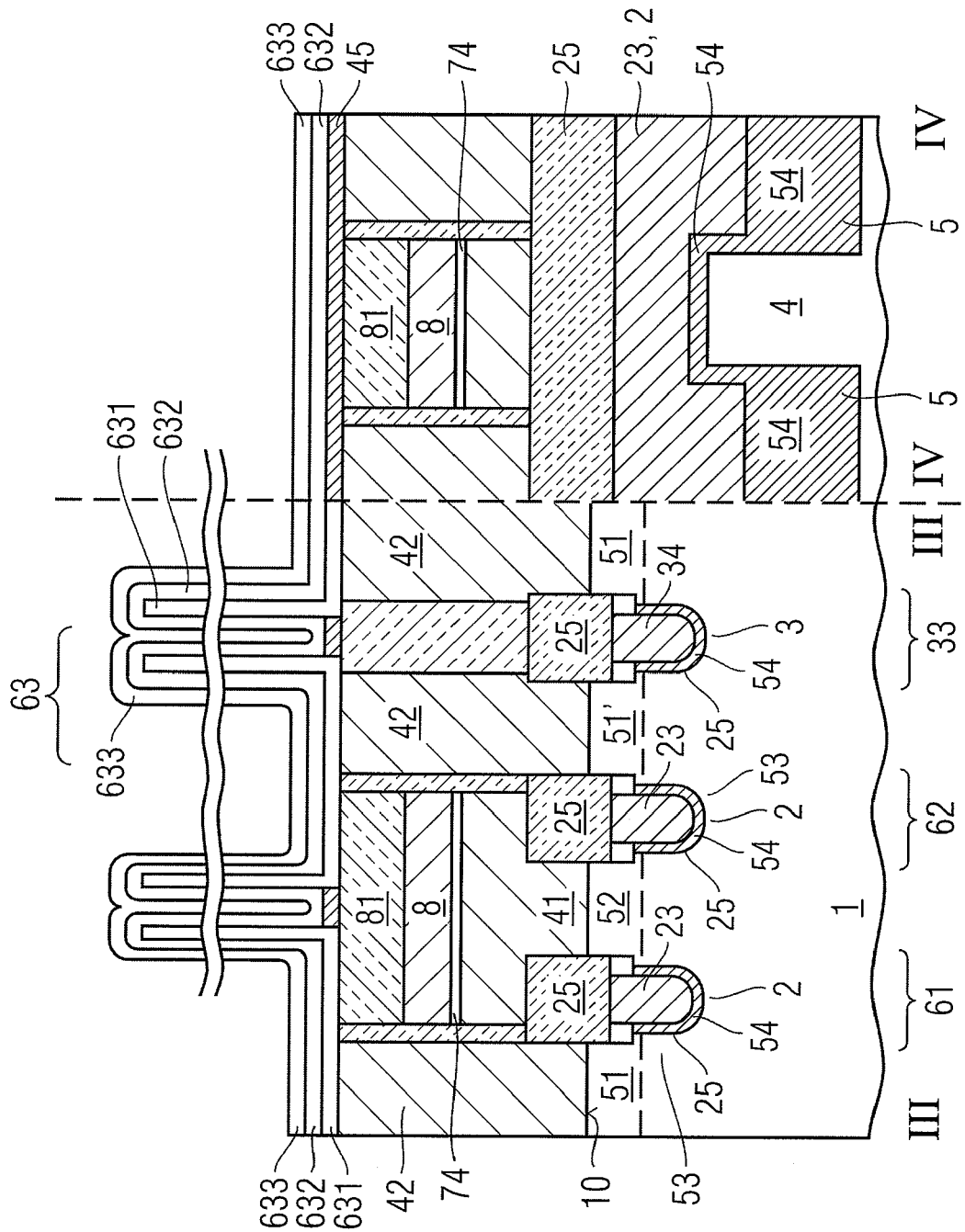
FIG. 8A shows a cross-sectional view of a completed memory cell in accordance with the exemplary embodiment.
Figure 8B:
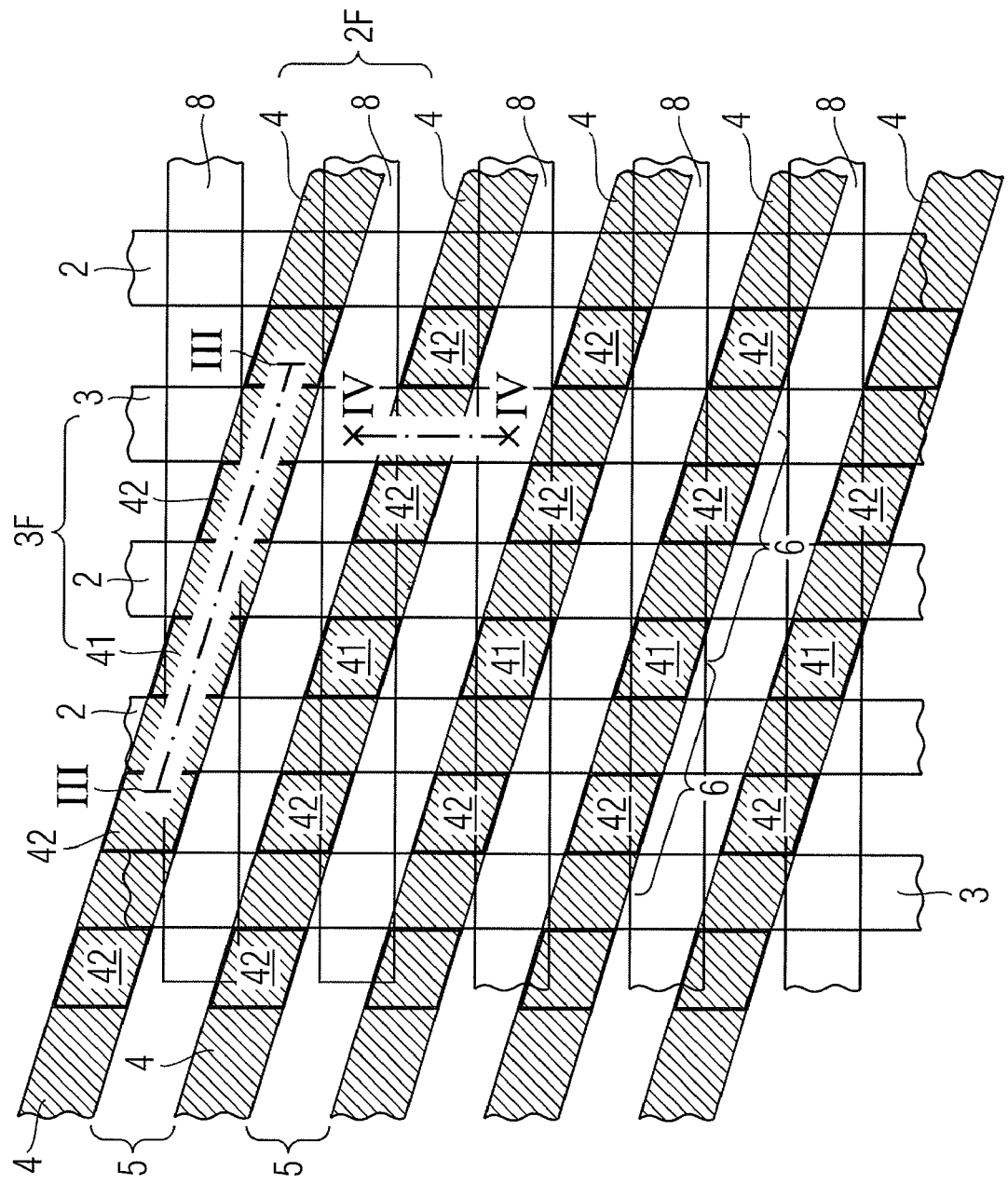
FIG. 8B shows a schematic layout of a completed memory cell array in accordance with an exemplary embodiment.

An exemplary cross-sectional view is shown in FIG. 8A. In particular, FIG. 8A shows a cross-sectional view of a memory cell array depicted in FIG. 8B. In FIG. 8B, also the positions of the respective cross-sectional views between III and III as well as between IV and IV are illustrated. As can be seen from FIG. 8B the wordlines 2 are disposed perpendicularly with respect to the bitlines 8, whereas the active areas intersect the wordlines as well as the bitlines at an angle which is different from 90°. As is shown in FIG. 8A, the stacked capacitor comprises a storage electrode 631, a capacitor dielectric 632 as well as a second capacitor electrode 633. The first capacitor electrode 631 is connected with the first source/drain region 51' via a node contact 42. A channel 53 is formed between the first and the second source/drain region 51', 52. The conductivity of the channel 53 is controlled by the gate electrode 23 of the transistor 62. When an appropriate voltage is applied to the gate electrode 23 of the access transistor 62, an information is read out from the storage capacitor 63. In particular, a charge stored in the corresponding first capacitor electrode 631 is sensed via the node contact 42. The information is transmitted from the first source/drain region 51' to the second source/drain region 52 and sensed by the corresponding bitline 8 via the bitline contact 41. As can be seen from FIG. 8A, the transistor is formed in the manner as has been described hereinabove with reference to FIGS. 1 to 7. The bitline 8 is disposed beneath the storage capacitor 63. The left hand portion of FIG. 8 shows a cross-sectional view of the memory cell between III and III, whereas the right hand portion of FIG. 8A shows the cross-sectional view which is taken between IV and IV. In the lower portion of the right hand portion of FIG. 8A, the corresponding transistor is shown. As can be seen, the bitline 8 extends in the direction which is perpendicular to the plane of the drawing, whereas the wordline 2 is in the direction of the plane of the drawing.

As is further shown in the cross-sectional view between III and III, an insulation gate line 3 is provided, by which adjacent memory cells are electrically insulated from each other. To be more specific, an insulation device 33 is provided, comprising a gate electrode 34 which controls an electrical current flowing between the first source/drain region 51 and the adjacent first source/drain region 51'. By applying an appropriate voltage to the gate electrode 34 of the insulation device 33, a current flow between the first source/drain region 51 and the adjacent first source/drain region 51' is avoided. Accordingly, the insulation gate line 3 serves as an insulation device.

FIG. 8B shows a plan view of the resulting structure. As can be seen, the wordlines 2 extend in a first direction, whereas the bitlines 8 extend in a second direction which is perpendicular with respect to the first direction. The active areas 4 are formed as continuous lines and are disposed in a direction which is neither along the first nor along the second direction. To be more specific, the continuous active area lines 4 intersect the wordlines 2 as well as the bitlines 8. In the plan view of FIG. 8B, also the corresponding node contacts 42 and bitline contacts 41 are shown.

Figure 9:
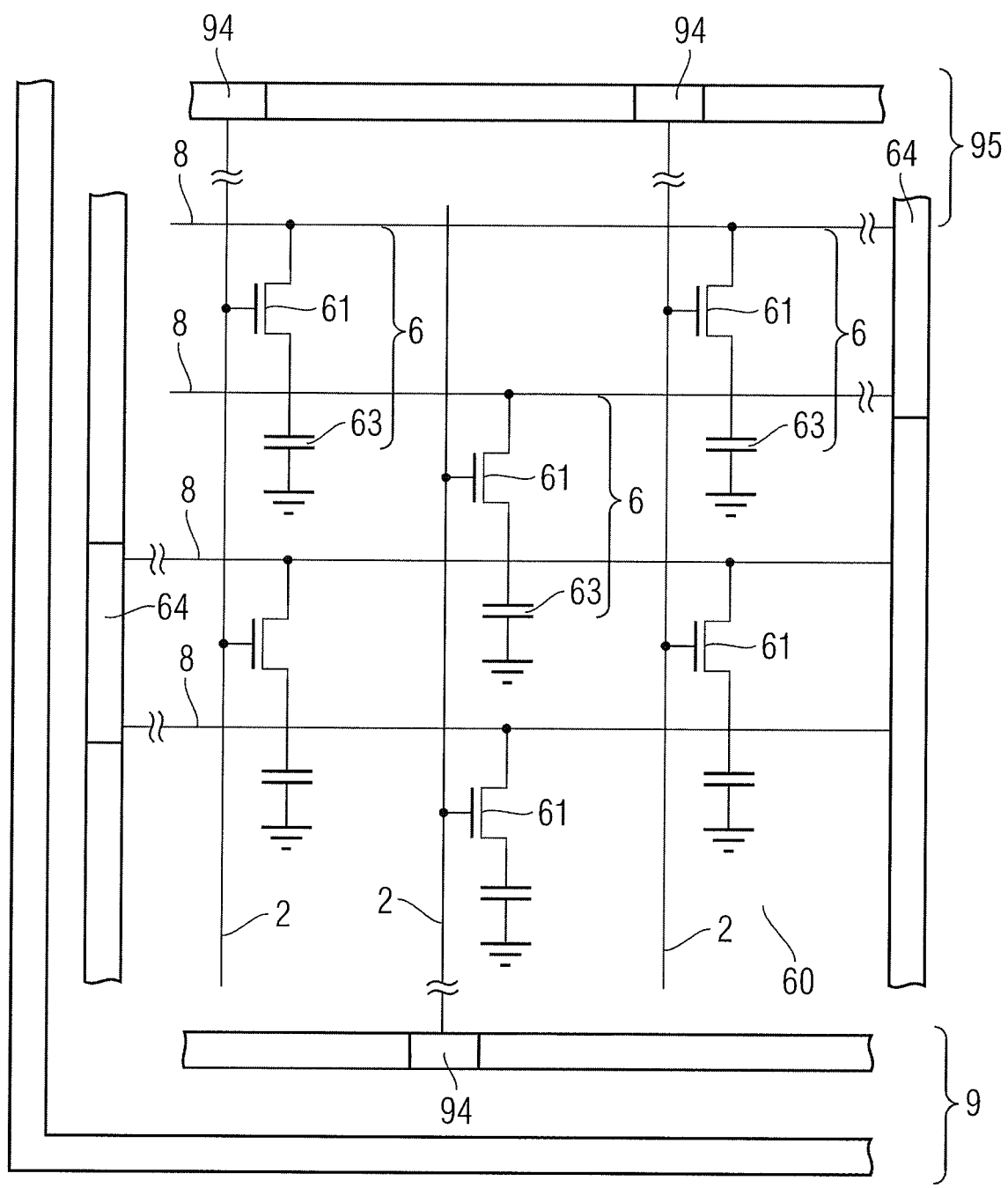
FIG. 9 shows a plan view of a completed memory device in accordance with the exemplary embodiment.

FIG. 9 shows a schematic layout of the corresponding memory device. As can be seen, a plurality of memory cells 6 are disposed in the memory cell array 60. Each of the memory cells 6 comprises a storage capacitor 63 as well as an access transistor 61. Wordlines 2 are provided and they are coupled to each of the gate electrodes which are assigned to the respective wordlines 2. Moreover, the bitlines 8 are connected with the second source/drain regions of the corresponding access transistors. The memory device further comprises a peripheral portion 9, comprising the support portion 95. In particular, the support portion 95 comprises the wordline drivers 94 as well as the sense amplifiers 64.

Referring to FIG. 10A, in a surface section oriented to a top surface 110 of a semiconductor substrate 100, wells may be formed, for example a p-doped well in a region of the surface section, in which n-MOSFETs are formed and an n-doped well in a region, in which p-MOSFETs are formed. The semiconductor substrate 100 may be, by way of example, a preprocessed single crystalline silicon wafer or a silicon-on-insulator wafer and may comprise further doped and undoped sections, epitaxial semiconductor layers supported by a base conductor or a base insulator as well as other semiconductor and insulator structures that have previously been fabricated. Into surface sections of the p-well orientated to the top surface 110, a heavy ion implant of the n-conductivity type may be performed to form a heavily n-doped region 150 having a bottom edge 105 at a distance d1 to the top surface 110. A first hardmask layer 111, for example a silicon nitride layer, may be deposited on the top surface 110. The first hardmask layer 111 may be patterned, for example according to a line/space pattern to form isolation trenches that extend along a first direction and that separate neighboring active area lines from each other. According to another embodiment that is shown in FIGS. 10A to 10D, further isolation trenches 131 132 running perpendicular to the active area lines may partition the active area lines to segments, wherein each segment comprises active areas 102 of two transistors arranged mirror-inverted to each other along the first direction. A bottom edge of the isolation trenches 131 has a greater distance to the top surface 110 as the bottom edge of the heavily n-doped regions 150.

The isolation trenches 131 may be filled with a dielectric fill material, for example silicon dioxide or silicon nitride, to form insulator structures 132. In accordance to an embodiment, the portion of the dielectric fill material that is deposited outside the isolation trenches 131 is removed through a chemical mechanical polishing process stopping on the upper edge of the first hardmask layer 111. According to another embodiment, the polishing process may stop on the top surface 110.

Then a second hardmask layer 112 may be deposited on the resulting structure, for example on top of the first hardmask 111 or on the top surface 110. The second hardmask layer 112 may be patterned according to a further line/space pattern, wherein the lines of the pattern may have a pitch equal to twice a minimum structural feature size for regularly repetitive line/stripe patterns using optical proximity effects. F may be for example 100, 90, 85, 75, 65, 55, 40 nm or less. The lines of the second hardmask 112, which may be, for example a carbon mask, extend along a second direction which intersects the first direction. The second direction may be perpendicular to the first direction or may be tilted to the first direction at 20 to 50 degree, for example 45 degree. First grooves 125a are etched into the substrate 100 using the second hardmask 112 as an etch mask. The bottom edge of the first grooves 125a in the semiconductor substrate 100 has a smaller distance to the top surface 110 than the bottom edge 105 of the heavily n-doped regions 150.

FIG. 10A shows an active area 102, that adjoins, in accordance to the illustrated example, an insulator structure 132. According to other embodiments, the isolation trenches run only parallel to the active area lines before and behind the cross-sectional plane, wherein MOSFETs neighboring along the first direction may be separated by isolation transistors.

The first groove 125a has a bottom edge at a distance to the top surface 110 that is smaller than the distance d1. Remnant portions of the first hardmask layer 111 and the second hardmask layer 112 may cover the semiconductor substrate 100. A spacer liner 114 is formed that lines the first groove 125a. In accordance to an embodiment, the spacer liner 114 may be a deposited dielectric liner, for example a CVD-silicon oxide or a silicon oxynitride. According to an exemplary embodiment, the sidewall liner 114 is a thermally grown silicon oxide.

Referring to FIG. 10B, the sidewall liner 114 is opened at the bottom of the first groove 125a, for example by a reactive ion etch or another anisotropic etch method. Then a second etch of the semiconductor substrate 100 may be performed to form a second groove 125b. The first groove 125a and the second groove 125b form a gate groove 125. Remnant portions of the spacer liner 114 form sidewall spacers 115 facing each other at the gate groove 125 in an upper portion of the gate groove 125. The sidewall structures 115 extend on opposite sidewalls of the gate groove 125. The width of a lower portion of the gate groove 125 along the first direction corresponds to the distance between the sidewall structures 115.

With regard to FIG. 10C, a gate dielectric 154 may be formed that lines the lower portion of the gate groove 125 below the sidewall structures 115. In accordance with an exemplary embodiment, the gate dielectric 154 may be a thermally grown silicon oxide liner. According to other embodiments, the gate dielectric 154 may be a deposited silicon oxide which may be nitrided afterwards or another oxide or silicon oxide of elements of the third or fourth group including oxides of rare earth, for example $Al_2O_3$, $HfO_2$, $HfSiO_2$, $CrSiO_2$, $DySiO_2$ or another high-k material. In case of thermally grown sidewall structures 115 and a thermally grown gate dielectric 154, bird's beak structures 115a may be formed in a transition region between the spacer structures 115 and the gate dielectric 154. A conductive material may be deposited to fill at least the lower portion of the gate groove 125 to form a gate electrode 155, which may form part of a wordline 156. An upper edge or top surface 123a of the gate electrode 155 may be provided in a distance to the top surface 110 of the substrate 100 that is less than the distance d1 between the bottom edge 105 of the heavily n-doped regions 150 and the top surface 110. In accordance with a further embodiment the gate electrode 155 may surround a portion of the channel region 153 on three sides.

As shown in FIG. 10D, an insulator material 156 may be deposited to fill the remaining gap in the gate grooves 125 between the top surface 110 of the semiconductor substrate 100 and the top surface 123a or upper edge of the gate electrode 155. Remnant portions of the first hardmask layer 111 may be removed.

The channel length of the transistor 160 comprising the source/drain regions 151, 152 formed by the heavily n-doped region 150 and a p-doped channel region 153 is defined by the parameters of the implant forming the heavily n-doped portions 150 and of the etch of the second groove 125b. As etch processes in silicon can be precisely defined, variations of the channel length between transistors of the same integrated circuit are small. The channel length is independent from the gate electrode material. If a metal is used as gate electrode material, the channel length is independent from metal recess processes. According to further examples, the spacer structures 115 may be etched back and covered to form gaps filled with air or vacuum as insulator structures between the gate electrode 155 and the source/drain regions 151, 152 of the transistor 160. Further, the spacer structures 115 may be replaced by other sidewall spacers made of another dielectric material.

While the invention has been described in detail and with reference to specific embodiments thereof, it will be apparent to one skilled in the art that various changes and modifications can be made therein without departing from the spirit and scope thereof. Accordingly, it is intended that the present invention covers the modifications and variations of this invention provided they come within the scope of the appended claims and their equivalents.

What is claimed is:

1. A method of fabricating an integrated circuit including a transistor, the method comprising:
    forming a gate groove extending in a surface of a semiconductor substrate;
    forming a first source/drain region and a second source/drain region in the semiconductor substrate, wherein the first and second source/drain regions are adjacent the substrate surface and extend to a first depth as measured from the substrate surface;
    forming a spacer on a sidewall of the gate groove, wherein the spacer extends from the substrate surface to a depth which is less than the first depth;
    forming a gate electrode in the gate groove, wherein a top surface of the gate electrode is disposed beneath the top surface of the semiconductor substrate at a second depth which is less than the first depth, the second depth being measured from the substrate surface, wherein an upper groove portion is defined above the gate electrode; and
    filling the upper groove portion with an insulating material, wherein the spacer is removed subsequent to forming the gate electrode and prior to filling the upper groove portion with an insulating material.

2. The method of claim 1, wherein filling the upper groove portion with an insulating material comprises non-conformally depositing the insulating material.

3. The method of claim 1, wherein:
    forming a gate groove comprises etching a first groove in the substrate surface and vertically extending the first groove; and
    the spacer is formed subsequent to etching the first groove and prior to vertically extending the first groove.

4. The method of claim 1, wherein forming a gate groove comprises etching a first groove in the substrate surface, and vertically extending the first groove by anisotropic etching of the semiconductor substrate.

5. The method of claim 4, wherein the spacer structure is effective as an etch mask for vertically extending the first groove.

6. The method of claim 1, wherein the spacer extends from the substrate surface to a depth which is greater than the second depth.

7. The method of claim 1, wherein the spacer structures are formed by thermal oxidation of the semiconductor substrate.

8. The method of claim 1, wherein a vacuum spacer is formed in the gate groove.

9. A method of fabricating an integrated circuit including a transistor, the method comprising:
    forming a gate groove extending in a surface of a semiconductor substrate, the gate groove being formed with a fin-like portion including a ridge at the bottom of the gate groove;
    forming a first source/drain region and a second source/drain region in the semiconductor substrate, wherein the first and second source/drain regions are adjacent the substrate surface and extend to a first depth as measured from the substrate surface;
    forming a spacer on a sidewall of the gate groove, wherein the spacer extends from the substrate surface to a depth which is less than the first depth; and
    forming a gate electrode in the gate groove, wherein a top surface of the gate electrode is disposed beneath the top surface of the semiconductor substrate at a second depth which is less than the first depth, the second depth being measured from the substrate surface, wherein an upper groove portion is defined above the gate electrode.

* * * * *